United States Patent
Teng et al.

(10) Patent No.: US 7,432,205 B2
(45) Date of Patent: Oct. 7, 2008

(54) METHOD FOR CONTROLLING POLISHING PROCESS

(75) Inventors: Ching-Wen Teng, Taoyuan County (TW); Chin-Kun Lin, Kaohsiung (TW); Boon Tiong Neo, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 160 days.

(21) Appl. No.: 11/306,053

(22) Filed: Dec. 15, 2005

(65) Prior Publication Data
US 2007/0138140 A1     Jun. 21, 2007

(51) Int. Cl.
*H01L 21/302* (2006.01)

(52) U.S. Cl. ............... 438/692; 438/687; 438/691; 438/692; 438/723; 438/724; 438/745; 216/79; 216/88; 216/89

(58) Field of Classification Search ............... 438/692; 216/79
See application file for complete search history.

(56) References Cited

U.S. PATENT DOCUMENTS

| 6,251,786 | B1 * | 6/2001 | Zhou et al. ............ 438/692 |
| 6,387,807 | B1 * | 5/2002 | Faubert et al. ......... 438/687 |
| 6,514,863 | B1 * | 2/2003 | He ..................... 438/692 |
| 6,620,276 | B1   | 9/2003 | Kuntze et al. .......... 156/164 |
| 2006/0211157 | A1 * | 9/2006 | Smith et al. ............ 438/6 |

FOREIGN PATENT DOCUMENTS

CN         1670924         9/2005

* cited by examiner

*Primary Examiner*—Shamim Ahmed
*Assistant Examiner*—Maki Angadi
(74) *Attorney, Agent, or Firm*—Jianq Chyun IP Office

(57) ABSTRACT

The invention is directed to a method for controlling a polishing process. The method comprises steps of providing a first wafer, wherein a thin film is located over the first wafer. A film average thickness distribution is obtained by measuring a plurality of thickness values of the thin film on a plurality regions over the wafer respectively. A removal rate recipe is determined according to the film average thickness distribution. A polishing process is performed according to the removal rate recipe.

16 Claims, 6 Drawing Sheets

METHOD FOR CONTROLLING POLISHING PROCESS

BACKGROUND OF THE INVENTION

1. Field of Invention

The present invention relates to a method for controlling a semiconductor manufacturing process. More particularly, the present invention relates to a method for controlling a polishing process.

2. Description of Related Art

The chemical mechanical polishing process is widely applied on the method for forming a structure, such as dual damascene, a metal plug and a top electrode of the trench capacitor, and on the planarization of the dielectric layer and becomes an indispensable process for manufacturing the integrated circuit.

In the chemical mechanical polishing process, the major process parameters include the pressure value applied on the polishing head, the composition of the slurry and the polishing particles, the material of the polishing pad, the relative linear rate between the wafer and the polishing pad and the temperature. However, the polishing result of the chemical mechanical polishing process is also affected by the factors other than the process parameters. Hence, the yield and the reliability of the polishing process are affected.

Taking the dual damascene process as an example, the copper film formed by using the electroplating process possesses relatively large thickness around the edge of the wafer. Accordingly, after the chemical mechanical polishing process is performed, the problems of copper remaining on the wafer edge and over polishing and dishing around the center of the wafer happen. Hence, the electrical properties of the dual damascene structures are not even over the entire wafer.

SUMMARY OF THE INVENTION

Accordingly, at least one objective of the present invention is to provide a method for controlling a polishing process capable of increasing the uniformity of the thin film layer after the polishing process is performed.

At least another objective of the present invention is to provide a method of manufacturing a dual damascene capable of improve the uniformity of the electrical properties of the dual damascene structures over the entire wafer.

To achieve these and other advantages and in accordance with the purpose of the invention, as embodied and broadly described herein, the invention provides a method for controlling a polishing process. The method comprises steps of providing a first wafer, wherein a thin film is located over the first wafer. A film average thickness distribution is obtained by measuring a plurality of thickness values of the thin film on a plurality regions over the wafer respectively. A removal rate recipe is determined according to the film average thickness distribution. A polishing process is performed according to the removal rate recipe.

In one embodiment of the present invention, the aforementioned step of determining the removal rate recipe according to the film average thickness distribution is accomplished by referring to a database storing a plurality of first records with respect to the film average thickness distribution and a plurality of second records with respect to a preferred removal rate distribution respectively corresponding to the first records.

In one embodiment of the present invention, the aforementioned step of determining the removal rate recipe comprises setting a plurality of pressure values applied on a plurality of regions of the first wafer towards to a polishing pad respectively.

In one embodiment of the present invention, the aforementioned step of determining the removal rate recipe comprises setting a relative linear rate between the first wafer and a polishing pad.

In one embodiment of the present invention, the aforementioned method further comprises a step of performing another method for controlling a polishing process on a second wafer by using an advanced process control method.

In one embodiment of the present invention, the aforementioned the polishing process is selected from a group consisting of a chemical mechanical polishing process and an electrochemical polishing process.

In one embodiment of the present invention, the aforementioned the material of the thin film includes copper.

In one embodiment of the present invention, the aforementioned method for forming the thin film is selected from a group consisting of an electroplating process and a chemical vapor deposition process.

The present invention also provides a method for manufacturing dual damascene. The method comprises steps of providing a first substrate, wherein a dielectric layer is located over the first substrate. A plurality of dual damascene openings are formed in the dielectric layer. A thin film is formed to cover the first substrate, wherein the thin film fills out the dual damascene openings. A plurality of thickness values of the thin film on a plurality of regions over the first substrate are measured respectively to obtain a film average thickness distribution. A removal rate recipe is determined according to the film average thickness distribution. A polishing process is performed on the first substrate according to the removal rate recipe until the dielectric layer is exposed.

In one embodiment of the present invention, the aforementioned step of determining the removal rate recipe according to the film average thickness distribution is accomplished by referring to a database storing a plurality of first records with respect to the film average thickness distribution and a plurality of second records with respect to a preferred removal rate distribution respectively corresponding to the first records.

In one embodiment of the present invention, the aforementioned step of determining the removal rate recipe comprises setting a plurality of pressure values applied on a plurality of regions of the first substrate towards to a polishing pad respectively.

In one embodiment of the present invention, the aforementioned step of determining the removal rate recipe comprises setting a relative linear rate between the first substrate and a polishing pad.

In one embodiment of the present invention, the aforementioned method further comprises a step of performing another method for forming a dual damascene on a second substrate by using an advanced process control method.

In one embodiment of the present invention, the aforementioned material of the thin film includes copper.

In one embodiment of the present invention, the aforementioned method for forming the thin film is selected from a group consisting of an electroplating process and a chemical vapor deposition process.

In one embodiment of the present invention, the aforementioned polishing process is selected from a group consisting of a chemical mechanical polishing process and an electrochemical polishing process.

In the present invention, the parameters for performing the polishing process are controlled according to the film average thickness distribution of the thin film. Therefore, the problems of copper remaining on the wafer edge, over polishing and dishing can be overcome. Further, the electrical properties of the dual damascene structures are uniform to each other over the entire wafer. Additionally, the film average thickness distribution of the prior wafer and the removal rate recipe used in the prior polish run on the prior wafer are used to estimate the current film average thickness distribution and the current removal rate recipe. Therefore, the electrical properties of the dual damascene structures on the different wafers are uniform.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
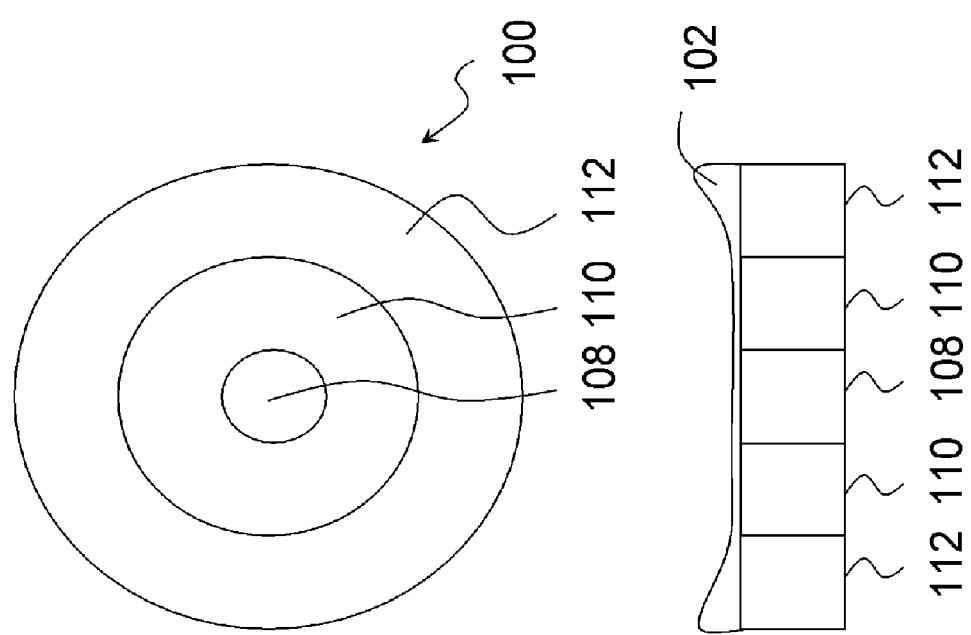
FIG. 1 shows a top view of a wafer 100 and a cross-section view of the wafer 100 along line I-I' according to a preferred embodiment of the invention.
Figure 2:
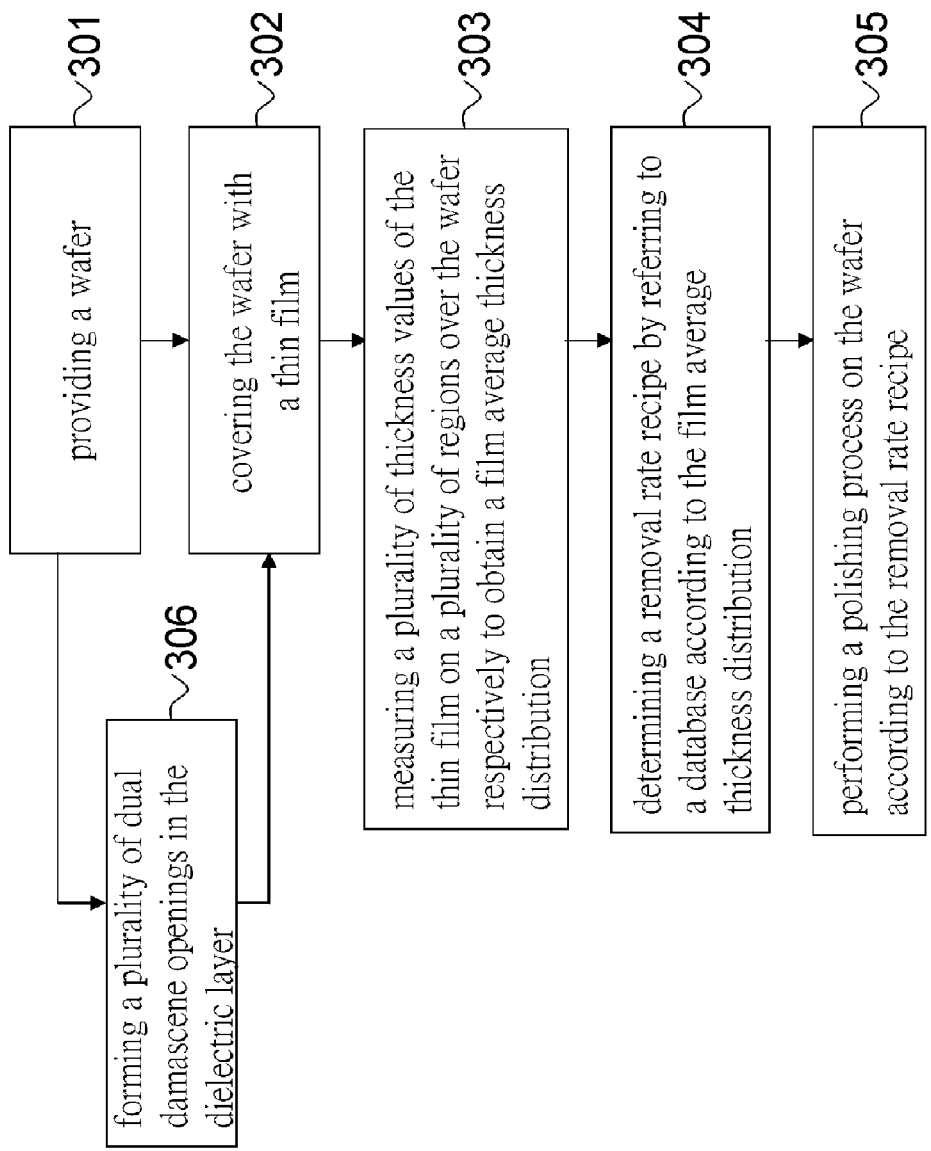
FIG. 2 is a flow chart illustrating a method for controlling a polishing process according to one embodiment of the present invention.

FIG. 1 shows a top view of a wafer 100 and a cross-section view of the wafer 100 along line I-I' according to a preferred embodiment of the invention. FIG. 2 is a flow chart illustrating a method for controlling a polishing process according to one embodiment of the present invention.

As shown in FIG. 1 and FIG. 2, in the step S301, a wafer 100 is provided. The wafer 100 can be, for example but not limited to, a 12 inch wafer. In the step S302, a thin film 102 is form to cover the wafer 100. The thin film 102 can be, for example but not limited to, made of copper. The method for forming the thin film 102 can be, for example but not limited to, a electroplating process or a chemical vapor deposition process.

Figure 3:
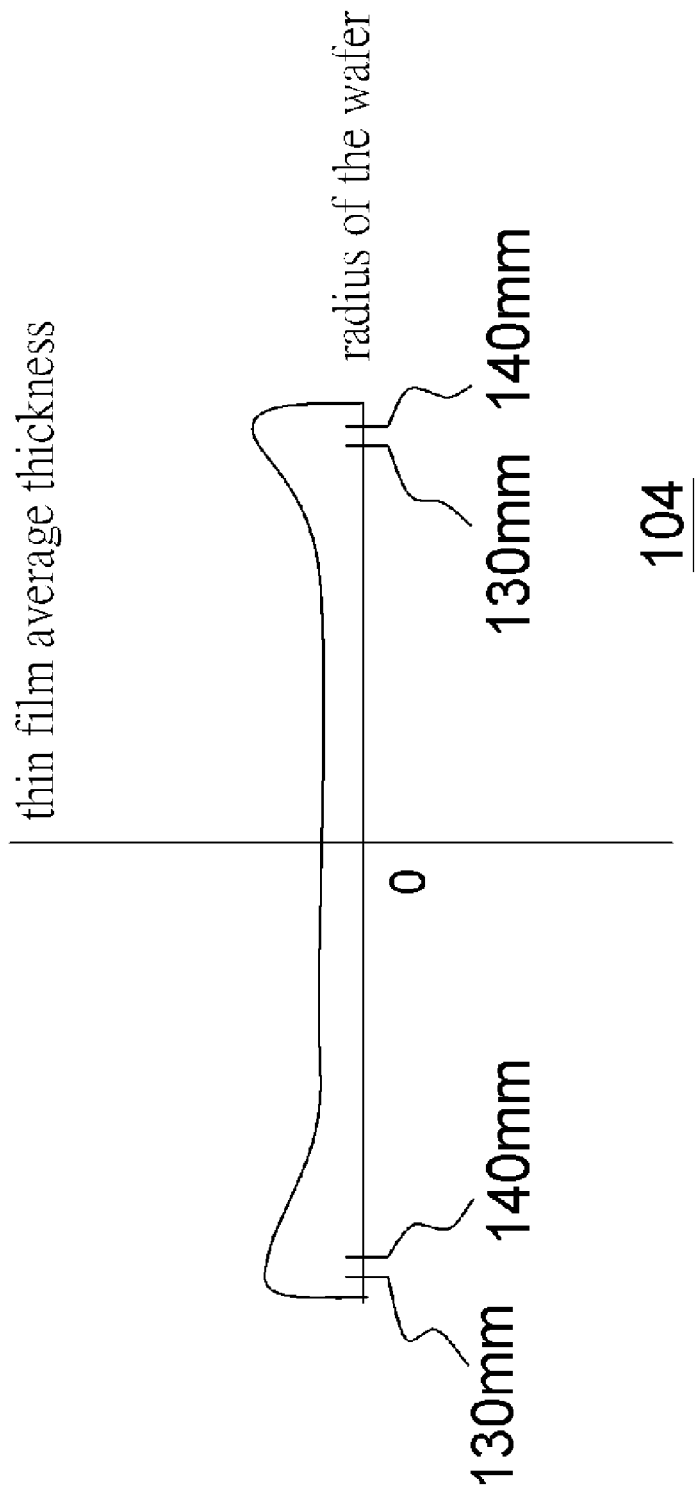
FIG. 3 shows a film average thickness distribution 104 of a thin film 102.

In the step S303, several thickness values of the thin film 102 are obtained by measuring the thickness of the thin film 102 on several regions of the wafer 100 so as to obtain a film average thickness distribution 104. The "film average thickness distribution" can be, for example, a function of the wafer radius and the average thickness of the thin film. Also, the film average thickness distribution 104 can be, for example, an average thickness of the thin film 102 over the center point of the wafer 100, a position on the wafer 100 away from the center point of the wafer 100 of about 130 mm and another position on the wafer 100 away from the center point of the wafer 100 of about 140 mm. Furthermore, the "film average thickness distribution" can be an average value of the thickness values of the thin film 102 at several points within a specified distance. Alternatively, the film average thickness distribution can be an average values of the thickness values obtained from measuring a single point of the thin film 102 on the wafer for several times. In order to simplify the description, the schematic diagrams for illustrating the film average thickness distribution are depicted in the same way. That is, 2-dimension diagram is used to represent the film average thickness distribution of the present invention. In FIG. 3, the x-axis represents a radius of the wafer 100. Further, the point labeled 0 represents the center point of the wafer 100. Also, the y-axis represents an average thickness of the thin film.

Figure 4:
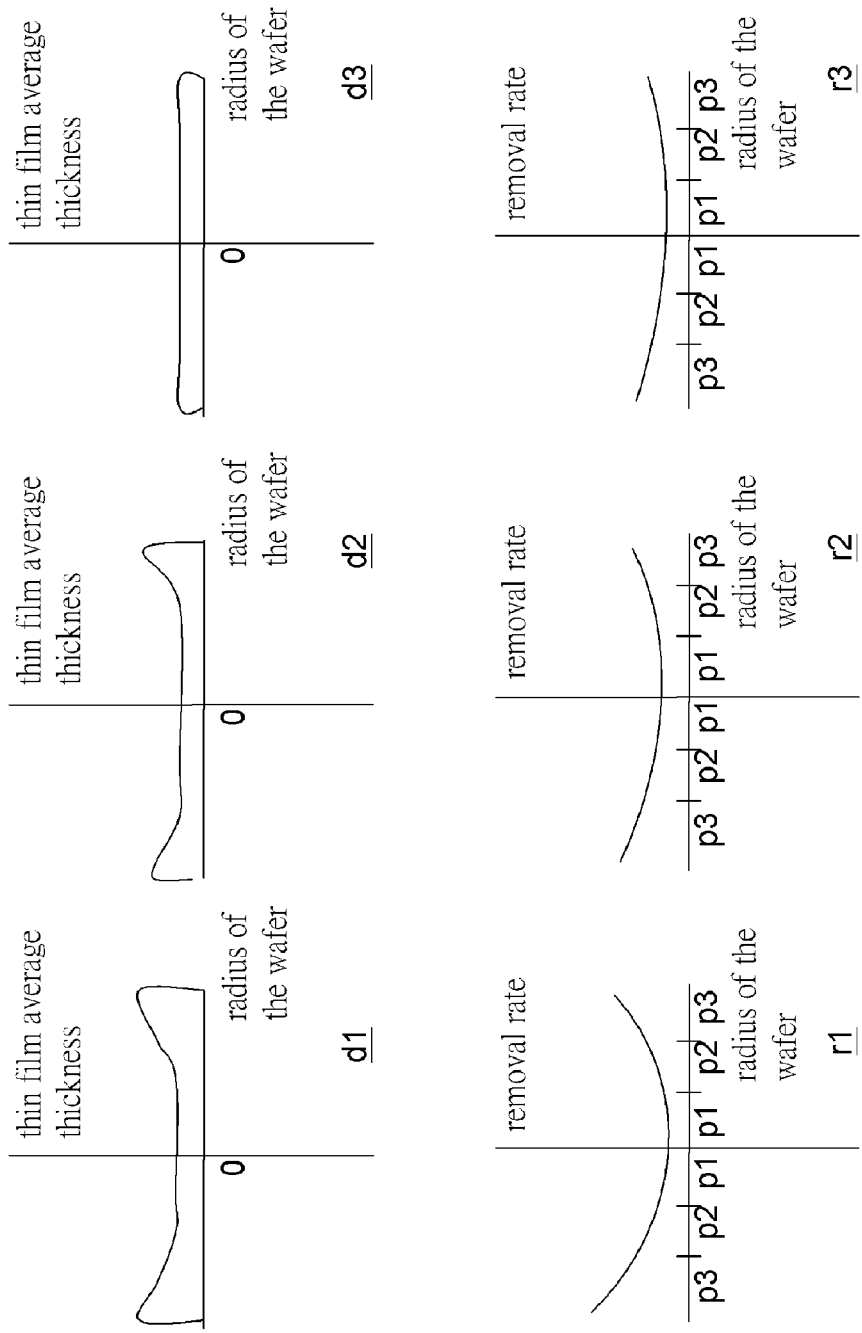
FIG. 4 shows a portion of the records storing in a database 106.

In the step S304, a removal rate recipe is determined by referring to a database 106 according to the film average thickness distribution. For example, the wafer is divided into several regions including region 108, region 110 and region 112. The removal rate recipe can be, for example but not limited to, determined by setting the pressure values applied on the regions 108, 110 and 112 respectively towards to a polishing pad. Alternatively, he removal rate recipe can be, for example but not limited to, determined by setting a relative linear rate between the wafer 100 and the polishing pad. The database 106 stores several records with respect to the film average thickness distribution and several records with respect to the preferred removal rate distribution (as shown in FIG. 4). In FIG. 4 showing a portion of the records storing in a database 106, the records comprise the film average thickness distributions d1, d2 and d3 and the corresponding preferred removal rate distributions r1, r2 and r3. Practically, the number of the records with respect to the film average thickness distributions and the corresponding preferred removal rate distributions stored in the database 106 are more than the number of the records shown in FIG. 4. The "removal rate distributions" can be, for example, a function of the removal rate and the radius of the wafer. To simplify the description of the present invention, the removal rate distributions r1, r2 and r3 are shown by 2-dimension diagrams respectively. The x-axis represents the radius of the wafer and the x-axis can be, for example, divided into several regions p1, p2 and p3. The y-axis represents the removal rate. For example, in the step 204, the film average thickness distribution 104 obtained by measuring the thickness values of the thin film over several regions of the wafer is compared with the film average thickness distributions d1, d2 and d3 in the database 106. Therefore, the one with the distribution most similar to the film average thickness distribution 104 is determined. For example, the average thickness values of the thin film over the center point of the wafer 100, a position on the wafer away from the center point of the wafer of about 130 mm and another position on the wafer away from the center point of the wafer of about 140 mm in the selected distribution are closest to the film average thickness distribution 104. Then, a preferred removal rate distribution corresponding to the selected distribution is selected to determine the removal rate recipe. As shown in FIG. 4, the film average thickness distribution d2 in the database 106 is most similar to the film average thickness distribution 104 on average thickness values over the three regions mentioned above. Therefore, the preferred removal rate distribution r2 corresponding to the film average thickness distribution d2 is selected to determine the removal rate recipe. The removal rate values in the regions p1, p2 and p3 are respectively corresponding to the removal rate values in the later performed polishing process in the regions 108, 110 and 112.

Moreover, in the step 305, a polishing process is performed on the wafer 100 according to the removal rate recipe obtained from the step 304. The polishing process can be, for example but not limited to, a chemical mechanical polishing process or an electrochemical polishing process.

Furthermore, the aforementioned control method further comprises a step of performing another method for controlling the polishing process. That is, one of the wafers in the wafer lot is sampled so as to perform the aforementioned method for controlling the polishing process on the wafers in the wafer lot. Accordingly, the determined removal rate recipe can be applied onto the polishing process performed on the other wafers in the same wafer lot.

To increase the production yield, it is necessary to decrease the sampling frequency. However, the manufacturing parameters varies with time so that the film average thickness distribution varies with time as well. Therefore, the changes of the film average thickness distribution cannot be neglected at the time the sampling frequency is decreased. Under the circumstance, the film average thickness distribution obtained by the prior sampling procedure can be used to estimate the current film average thickness distribution. Accordingly, the estimated current film average thickness distribution is used to determine the removal rate recipe. Alternatively, the removal rate recipe obtained from the prior sampling procedure can be used to estimate the current removal rate recipe. This kind of technology can be accomplished by an advanced process control method.

In the present invention, the film average thickness distribution is used to determine the removal recipe so that the problem that the uneven thin film within wafer after the polishing process is performed can be overcome. Also, as described above, the film average thickness distribution or the removal rate recipe obtained from the prior sampling procedure is used to estimate the current film average thickness distribution or the current removal rate recipe so that the wafer-to-wafer polishing quality can be well controlled.

Figure 5A:
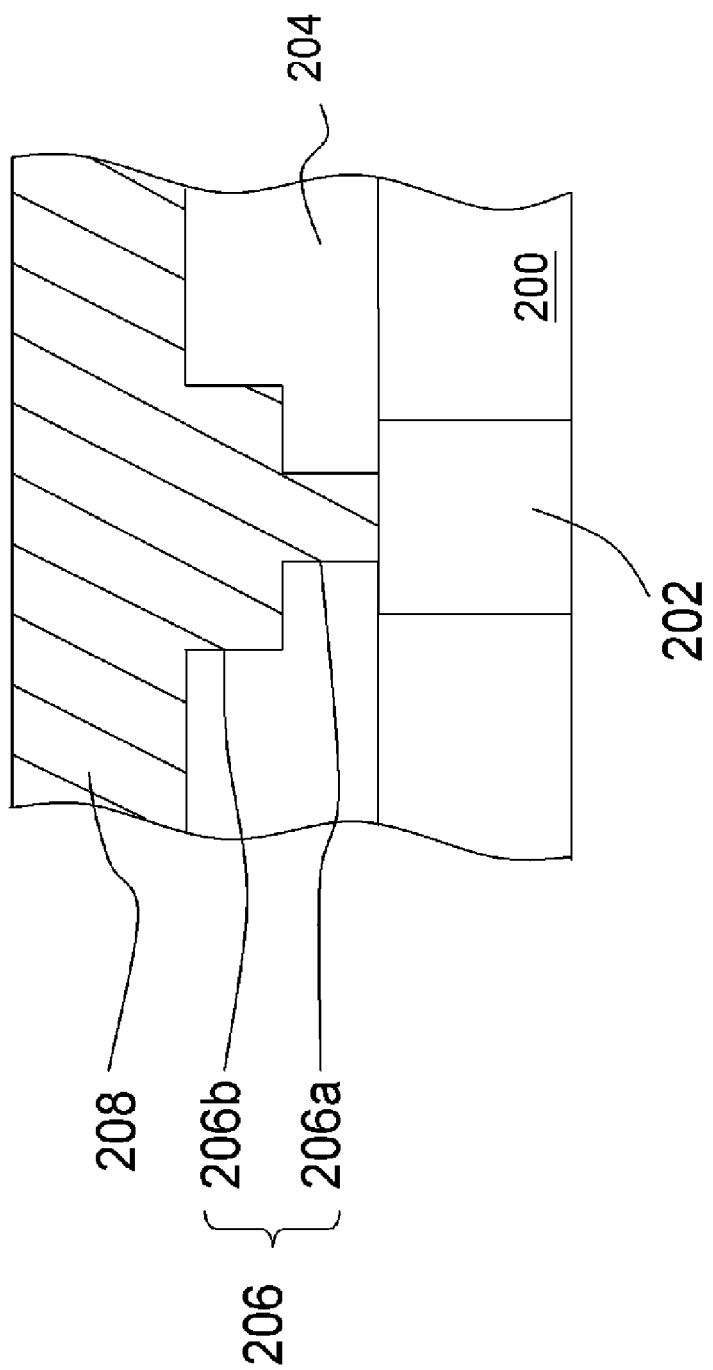
FIGS. 5A through 5B are cross-sectional views showing a method for manufacturing a dual damascene according another embodiment of the present invention.
Figure 5B:
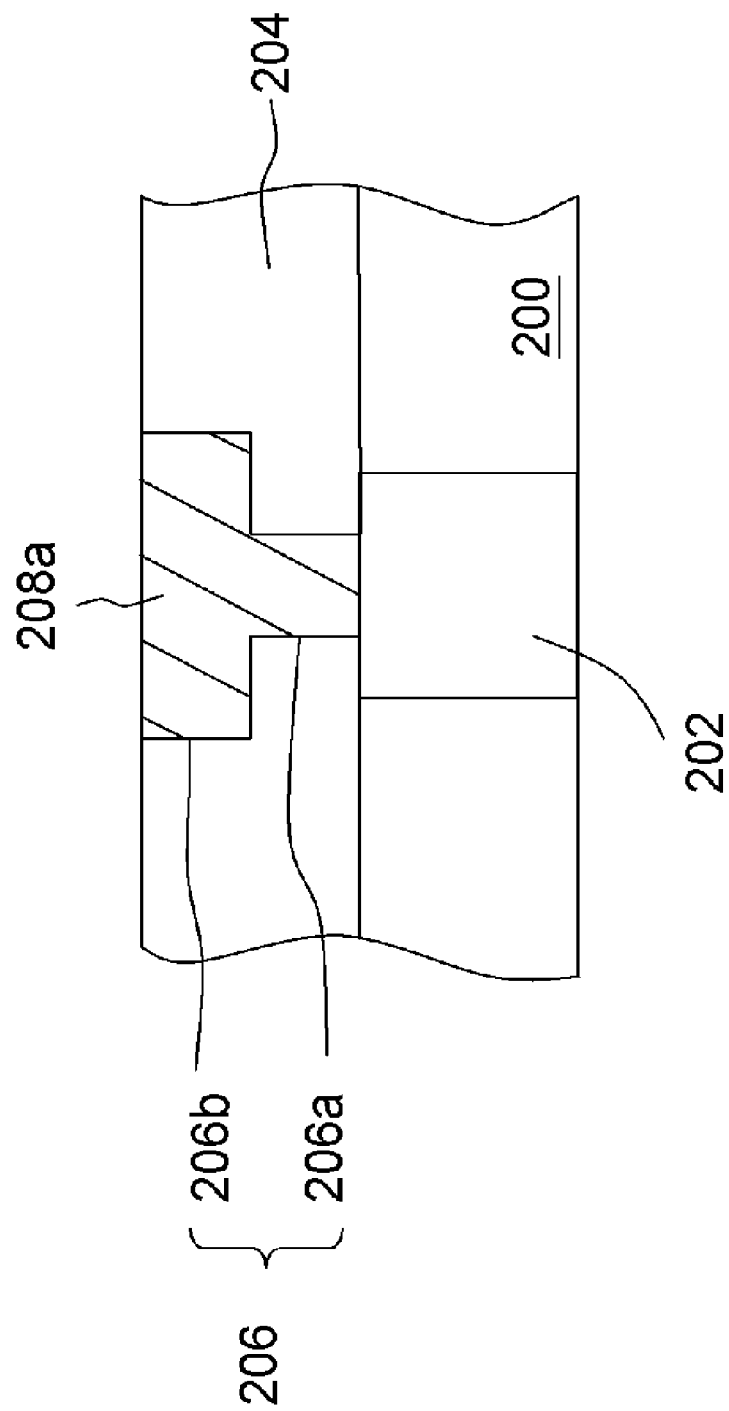

In another embodiment, the aforementioned method for controlling the polishing process can be applied on the dual damascene process. FIGS. 5A through 5B are cross-sectional views showing a method for manufacturing a dual damascene according another embodiment of the present invention.

As shown in FIG. 2 and FIG. 5A, a wafer 200 is provided to be a substrate for forming a dual damascene thereon (step 301). The wafer 200 possesses, for example, a semiconductor device 202 formed thereon and a dielectric layer 204 covers the wafer 200.

A dual damascene opening 206 is formed in the dielectric layer 204 over the wafer 200 (step 306). The dual damascene opening 206 is located in the dielectric layer 204 and includes an opening 206a predetermined to be filled with a metal plug and an opening 206b predetermined to filled with a conductive wire. The method for forming the dual damascene opening 206 is well known in the art and is not described herein.

Then, a thin film 208 is formed to cover the wafer 200 (step 302). The thin film 208 fills out the dual damascene opening 206 to be the material for forming the metal plug and the conductive wire. The thin film 208 can be, for example but not limited to, made of copper. The method for forming the thin film 208 can be, for example but not limited to, electroplating process.

Thereafter, several thickness values of the thin film 208 are obtained by measuring the thickness of the thin film 208 on several regions of the wafer 200 so as to obtain a film average thickness distribution (step 303). The detail description for the step 303 is illustrated in the previous embodiment.

A removal rate recipe is determined according to the film average thickness distribution (step 304). The detail description for the step 304 is also illustrated in the previous embodiment.

As shown in FIG. 5B, a polishing process is performed on the wafer 200 according to the removal rate recipe obtained from the step 304 until the dielectric layer 204 is exposed to form a dual damascene 208a (step 305). The polishing process can be, for example but not limited to, a chemical mechanical polishing process or an electrochemical polishing process.

According to the description in the previous embodiment, the method for forming the dual damascene further comprises a step of performing another method for forming the dual damascene over another substrate. Additionally, by applying an advanced process control method, the film average thickness distribution obtained by the prior sampling procedure can be used to estimate the current film average thickness distribution so as to determine the current removal rate recipe for being applied onto the dual damascene process. Alternatively, the removal rate recipe obtained from the prior sampling procedure can be used to estimate the current removal rate recipe.

In the present invention, the parameters for performing the polishing process are controlled according to the film average thickness distribution of the thin film. Therefore, the problems of copper remaining on the wafer edge, over polishing and dishing can be overcome. Further, the electrical properties of the dual damascene structures are uniform to each other over the entire wafer. Additionally, the film average thickness distribution of the prior wafer and the removal rate recipe used in the prior polish run on the prior wafer are used to estimate the current film average thickness distribution and the current removal rate recipe. Therefore, the electrical properties of the dual damascene structures on the different wafers are uniform.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A method for controlling a polishing process, comprising:
   providing a first wafer, wherein a thin film is located over the first wafer;
   obtaining a film average thickness distribution by measuring a plurality of thickness values of the thin film on a plurality regions over the wafer respectively;
   determining a removal rate recipe according to the film average thickness distribution by referring to a database storing a plurality of first records with respect to the film average thickness distribution and a plurality of second records with respect to preferred removal rate distribution respectively corresponding to the first records to select one first record with respect to the film average thickness distribution most similar to the film average thickness distribution; and
   performing a polishing process according to the removal rate recipe, wherein the removal rate recipe is a second record with respect to a preferred removal rate distribution corresponding to the selected first record with respect to the film average thickness distribution.

2. The method of claim 1, wherein the step of determining the removal rate recipe comprises setting a plurality of pressure values applied on a plurality of regions of the first wafer towards to a polishing pad respectively.

3. The method of claim 1, wherein the step of determining the removal rate recipe comprises setting a relative linear rate between the first wafer and a polishing pad.

4. The method of claim 1 further comprising a step of performing another method for controlling a polishing process on a second wafer by using an advanced process control method.

5. The method of claim 1, wherein the polishing process is selected from a group consisting of a chemical mechanical polishing process and an electrochemical polishing process.

6. The method of claim 1, wherein the material of the thin film includes copper.

7. The method of claim 1, wherein the method for forming the thin film is selected from a group consisting of an electroplating process and a chemical vapor deposition process.

8. A method for manufacturing dual damascene, comprising:
   providing a first substrate, wherein a dielectric layer is located over the first substrate;
   forming a plurality of dual damascene openings in the dielectric layer;
   forming a thin film to cover the first substrate, wherein the thin film fills out the dual damascene openings;
   measuring a plurality of thickness values of the thin film on a plurality of regions over the first substrate respectively to obtain a film average thickness distribution;
   determining a removal rate recipe according to the film average thickness distribution by referring to a database storing a plurality of first records with respect to the film average thickness distribution and a plurality of second records with respect to a preferred removal rate distribution respectively corresponding to the first records to select one first record with respect to the film average thickness distribution most similar to the film average thickness distribution; and
   performing a polishing process on the first substrate according to the removal rate recipe until the dielectric layer is exposed, wherein the removal rate recipe is a second record with respect to a preferred removal rate distribution corresponding to the selected first record with respect to the film average thickness distribution.

9. The method of claim 8, wherein the step of determining the removal rate recipe comprises setting a plurality of pressure values applied on a plurality of regions of the first substrate towards to a polishing pad respectively.

10. The method of claim 8, wherein the step of determining the removal rate recipe comprises setting a relative linear rate between the first substrate and a polishing pad.

11. The method of claim 8 further comprising a step of performing another method for forming a dual damascene on a second substrate.

12. The method of claim 11, wherein the step of performing the dual damascene process on the second substrate utilizes an advanced process control method.

13. The method of claim 8, wherein the material of the thin film includes copper.

14. The method of claim 8, wherein the method for forming the thin film is selected from a group consisting of an electroplating process and a chemical vapor deposition process.

15. The method of claim 8, wherein the polishing process is selected from a group consisting of a chemical mechanical polishing process and an electrochemical polishing process.

16. A method for controlling a polishing process, comprising:
   providing a first wafer, wherein a thin film is located over the first wafer;
   obtaining a film average thickness distribution by measuring a plurality of thickness values of the thin film on a plurality regions over the wafer respectively;
   determining a removal rate recipe according to the film average thickness distribution by referring to a database storing a plurality of first records with respect to the film average thickness distribution and a plurality of second records with respect to a preferred removal rate distribution respectively corresponding to the first records to select one first record with respect to the film average thickness distribution most similar to the film average thickness distribution;
   performing a polishing process according to the removal rate recipe, wherein the removal rate recipe is a second record with respect to a preferred removal rate distribution corresponding to the selected first record with respect to the film average thickness distribution; and
   performing another method for controlling a polishing process on a second wafer by using an advanced process control method.

* * * * *